US009634665B2

(12) United States Patent
Chen

(10) Patent No.: US 9,634,665 B2
(45) Date of Patent: Apr. 25, 2017

(54) LEVEL SHIFTERS AND INTEGRATED CIRCUITS THEREOF

(71) Applicant: TAIWAN SEMICONDUCTOR MANUFACTURING COMPANY, LTD., Hsinchu (TW)

(72) Inventor: Bo-Ting Chen, Fengyuan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 524 days.

(21) Appl. No.: 13/786,044

(22) Filed: Mar. 5, 2013

(65) Prior Publication Data

US 2013/0181741 A1   Jul. 18, 2013

Related U.S. Application Data

(63) Continuation of application No. 12/872,079, filed on Aug. 31, 2010, now Pat. No. 8,405,442.

(60) Provisional application No. 61/254,436, filed on Oct. 23, 2009.

(51) Int. Cl.
 *H03L 5/00* (2006.01)
 *H03K 19/0175* (2006.01)
 *H03K 3/356* (2006.01)
 *H03K 19/20* (2006.01)

(52) U.S. Cl.
 CPC ............ *H03K 19/017509* (2013.01); *H03K 3/356113* (2013.01); *H03K 19/20* (2013.01)

(58) Field of Classification Search
 None
 See application file for complete search history.

(56) References Cited

U.S. PATENT DOCUMENTS

| 6,011,421 A | * | 1/2000 | Jung ............................. 327/333 |
| 7,843,222 B1 | * | 11/2010 | Shiah et al. ................... 326/81 |
| 2001/0020840 A1 | * | 9/2001 | Kojima ......................... 323/282 |

(Continued)

FOREIGN PATENT DOCUMENTS

| KR | 10-2005-0079803 | 8/2005 |
| TW | 200539575 | 12/2005 |

OTHER PUBLICATIONS

OA dated Feb. 22, 2012 from corresponding application No. CN 201010523487.3.

*Primary Examiner* — Lincoln Donovan
*Assistant Examiner* — Khareem E Almo
(74) *Attorney, Agent, or Firm* — Hauptman Ham, LLP

(57) ABSTRACT

An integrated circuit including a first level shifter configured to receive a first input signal and a first power supply signal, and to output a first output signal. The integrated circuit further includes a first inverter configured to receive the first output signal, and to output a first inverter signal. The integrated circuit further includes a second level shifter configured to receive a second input signal and a second power supply signal, and to output a second output signal, wherein a voltage level of the second power supply signal is different from a voltage level of the first power supply signal. The integrated circuit further includes a second inverter configure to receive the second output signal, and to output a second inverter signal. The integrated circuit further includes an output buffer configured to receive the first inverter signal and the second inverter signal, and to output a buffer output signal.

20 Claims, 4 Drawing Sheets

(56) References Cited

U.S. PATENT DOCUMENTS

2004/0196067 A1* 10/2004 Hossain et al. ............... 326/112
2007/0008001 A1* 1/2007 Sanchez et al. ................ 326/80

* cited by examiner

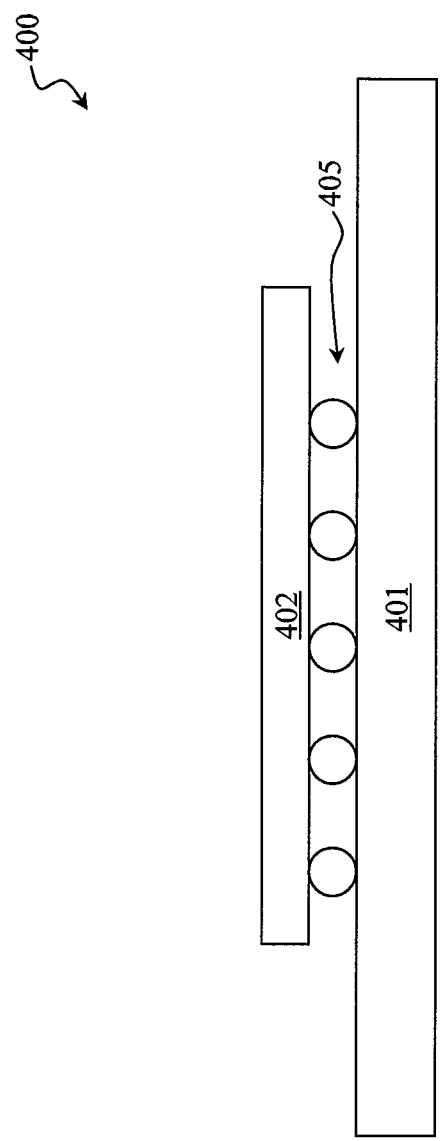

LEVEL SHIFTERS AND INTEGRATED CIRCUITS THEREOF

CROSS-REFERENCE TO RELATED APPLICATIONS

The present application is a continuation application of U.S. application Ser. No. 12/872,079, entitled "Level Shifters and Integrated Circuits Thereof," filed on Aug. 31, 2010, which claims priority of U.S. Provisional Patent Application Ser. No. 61/254,436, filed on Oct. 23, 2009, both of which are incorporated herein by reference in their entirety.

TECHNICAL FIELD

The present disclosure relates generally to the field of semiconductor circuits, and more particularly, to level shifters and integrated circuits thereof.

BACKGROUND

As the semiconductor technology develops, an integrated circuit often contains some devices operating at a high voltage level, and other devices operating at a low voltage level. The low voltage devices may not tolerate a high voltage signal. Device failures happen frequently, when the low voltage devices operate with the high voltage signal. In order to protect the low voltage devices from the high voltage signals, the integrated circuit often includes an input/output (I/O) circuit as an interface between the low voltage devices and the high voltage devices. The I/O circuit allows the low voltage devices communicating with the high voltage devices, while protecting the low voltage devices from interfered by the high voltage signals.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIG. 4 is a schematic drawing illustrating a system including an exemplary integrated circuit disposed over a substrate board.

DETAILED DESCRIPTION

Figure 1:
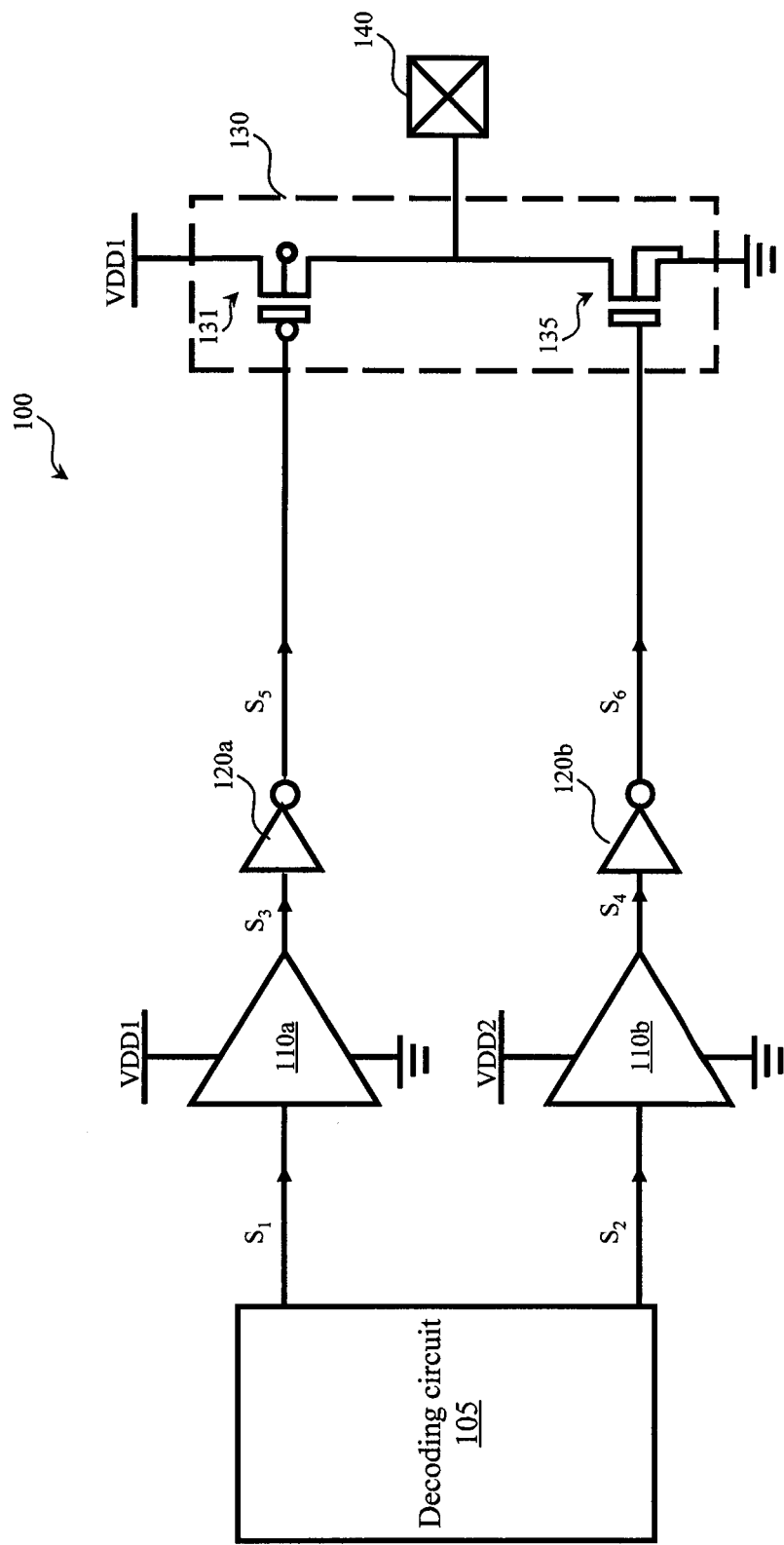
FIG. 1 is a schematic drawing illustrating an exemplary integrated circuit including an input/output (I/O) interface.

The conventional I/O circuit has various I/O devices, e.g., 1.8-V I/O devices and 3.3-V I/O devices. The conventional I/O circuit can level-shift an input voltage signal swinging between 0 V and 0.9 V output from core devices to between 0 V and 3.3 V. Conventionally, the core devices, the 1.8-V I/O devices, and the 3.3-V I/O devices have different gate oxide thicknesses. To form various thicknesses of the gate oxide layers, a number of thin film processes, mask layers, photolithographic process, and/or etch processes are used. The process for forming the gate oxide layers having three different thicknesses is complicated and costly.

To avoid the complicated and expensive fabrication process, a conventional process has been proposed to form the same gate oxide thickness for the 1.8-V I/O devices and the 3.3-V I/O devices. Conventionally, the gate oxide process of the 3.3-V I/O devices can be skipped such that a desired operation of the I/O circuit can be achieved. It is found that a gate-source voltage drop $V_{GS}$ of about 3.3 V and/or a drain-source voltage drop $V_{DS}$ of about 3.3 V may be applied to the 3.3-V I/O devices. As noted, the 1.8-V I/O devices have a reduced gate oxide thickness. The gate oxide layer of the 1.8-V I/O devices may not sustain the 3.3-V gate-source voltage drop $V_{GS}$. The 1.8-V I/O devices may have a gate oxide integrity issue. Furthermore, the 3.3-V drain-source voltage drop $V_{DS}$ of the 1.8-V I/O devices may enhance a hot carrier injection.

Based on the foregoing, I/O interfaces of integrated circuits are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

Following are descriptions regarding exemplary integrated circuits including an I/O interface and operating methods thereof. For merely the purpose of descriptions, input voltage signals swinging between 0 V and 0.9 V can be level-shifted to between 0 V and 3.3 V. It is noted that voltage levels described below in conjunction with FIG. 1 are merely exemplary. The scope of the invention is not limited thereto.

FIG. 1 is a schematic drawing illustrating an exemplary integrated circuit including an input/output (I/O) interface. In FIG. 1, an integrated circuit 100 can include a decoding circuit 105. The decoding circuit 105 can decode signals output from core devices (not shown), outputting voltage signals $S_1$ and $S_2$. In some embodiments, the voltage signals $S_1$ and $S_2$ can swing between a first voltage level, e.g., about 0 V, and a second voltage level, e.g., about 0.9 V.

The integrated circuit 100 can include at least one level shifter, e.g., level shifters 110a and 110b, coupled with at least one inverter, e.g., inverters 120a and 120b, respectively. The level shifters 110a and 110b can receive the voltage signals $S_1$ and $S_2$, respectively, output from the decoding circuit 105. The level shifter 110a can be coupled between, for example, a power supply voltage VDD1 and a ground voltage VSS. In some embodiments, the power supply voltage VDD1 can be about 3.3 V. The level shifter 110b can be coupled between, for example, a power supply voltage VDD2 and a ground voltage VSS. In some embodiments, the power supply voltage VDD2 can be about 1.8 V.

In some embodiments, the level shifter 110a can receive the voltage signal $S_1$ from the decoding circuit 105, outputting a voltage signal $S_3$ swinging between the first voltage level, e.g., about 0 V, and a third voltage level, e.g., about 3.3 V. The third voltage level, e.g., 3.3 V, is higher than the second voltage level, e.g., 0.9 V.

In some embodiments, the level shifter 110b can receive the voltage signal $S_2$ from the decoding circuit 105, outputting a voltage signal $S_4$ swinging between the first voltage levels, e.g., about 0 V, and a fourth voltage level, e.g., about 1.8 V.

Referring to FIG. 1, the inverter 120a can receive the voltage signal $S_3$ output from the level shifter 110a, outputting a voltage signal $S_5$ swinging between the third voltage level, e.g., about 3.3 V, and the fourth voltage level, e.g., about 1.8 V. The fourth voltage level, e.g., 1.8 V, is higher than the first voltage level, e.g., 0 V, and lower than the third voltage level, e.g., 3.3 V. In some embodiments, the fourth voltage level is higher than the second voltage level, e.g., 0.9 V.

In some embodiments, the inverter 120b can receive the voltage signal $S_4$ output from the level shifter 110b, outputting a voltage signal $S_6$ swinging between the first voltage level, e.g., about 0 V, and the fourth voltage level, e.g., about 1.8 V.

Referring to FIG. 1, the integrated circuit 100 can include an output buffer 130 coupled with the inverters 120a and 120b. The output buffer 130 can be coupled between, for example, the power supply voltage VDD1 and the ground voltage VSS. The output buffer 130 can include a transistor 131 of a first type, e.g., a PMOS transistor, and a transistor 135 of a second type, e.g., NMOS transistor. The transistors 131 and 135 can receive the voltage signals $S_5$ and $S_6$ output from the inverters 120a and 120b, respectively. The voltage signals $S_5$ and $S_6$ output from the inverters 120a and 120b can control the output buffer 130 outputting a voltage signal that can swing between the first voltage level, e.g., 0 V, and the third voltage level, e.g., 3.3 V. The voltage signal output from the output buffer 130 can be coupled to a pad 140. It is noted that the types of the transistors 131 and 135 are merely exemplary. The scope of the invention is not limited thereto.

In embodiments level-shifting the input voltage signal swinging from 0 V and 0.9 V to between 0 V and 3.3 V, the transistor 131 can be formed by a 1.8-V process technique. The source end of the transistor 131 can be coupled with the power supply voltage VDD1, e.g., 3.3 V. As noted, the voltage signals $S_5$ applied to the gate of the transistor 131 can swing between the voltage levels 1.8 V and 3.3 V. It is found that the voltage drop $V_{GS}$ between the gate and the source of the transistor 131 can be no more than the difference of the third voltage level, e.g., 3.3 V, and the fourth voltage level, e.g., 1.8 V. The voltage drop $V_{GS}$ of about 1.8 V or less can desirably reduce the gate dielectric layer integrity issue.

In some embodiments, the transistors 131 and/or 135 can be a P-type high voltage (HV) device and an N-type HV device, respectively. The HV devices can have asymmetric source and drain structures. For example, a drain side of the HV device can have a lightly doped drain (LDD) that can sustain the voltage drop $V_{DS}$ between the drain and the source of the HV device. The asymmetric HV device can desirably reduce the hot carrier injection issue.

Figure 2:
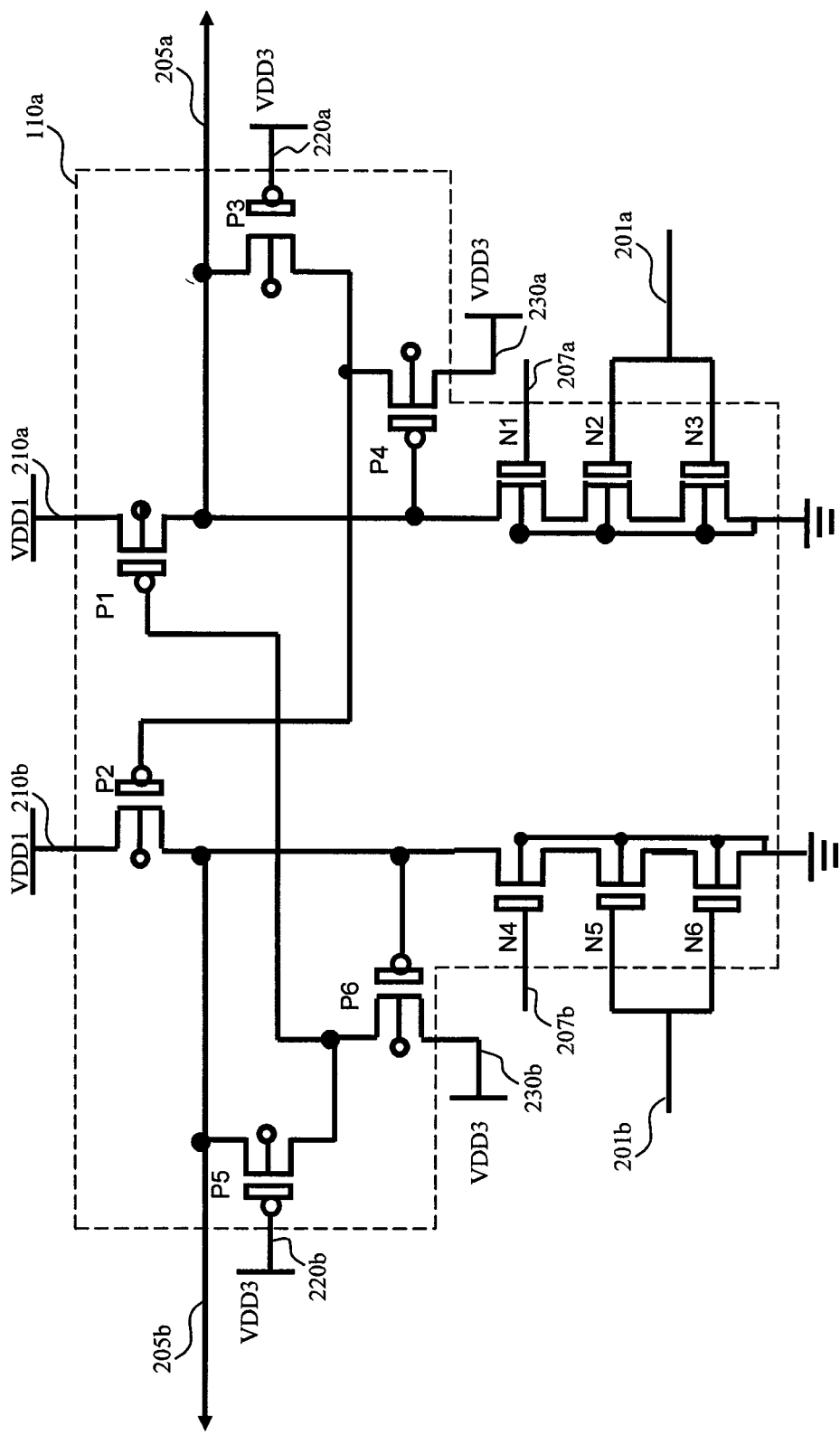
FIG. 2 is a schematic drawing illustrating an exemplary level shifter.

FIG. 2 is a schematic drawing illustrating an exemplary level shifter. In FIG. 2, the level shifter 110a can include at least one input end, e.g., input ends 201a and 201b, and at least one output end, e.g., output ends 205a and 205b. The level shifter 110a can include at least one transistor of the first type, e.g., P-type transistors P1 and P2, between the input ends 201a-201b and the output ends 205a-205b. In some embodiments, the transistors P1 and P2 can be directly or indirectly coupled between the input ends 201a-201b and the output ends 205a-205b. In some other embodiments, the transistors P1 and P2 can be coupled between power supply nodes 210a and 210b and the output nodes 205a and 205b, respectively.

Referring to FIG. 2, the level shifter 110a can include at least one transistor of the second type, e.g., N-type transistors N1-N6. The transistors N1-N3 and N4-N6 can be coupled with the output nodes 205a and 205b, respectively. In some embodiments, the transistors N1 and N4 can be I/O or HV devices. In some other embodiments, the transistors N2 and N5 can be native devices. In still some other embodiments, the transistors N3 and N6 can have a structure similar to the core device.

The level shifter 110a can include at least one transistor of the first type, e.g., P-type transistors P3 and P5. The transistors P3 and P5 can be coupled with the output nodes 205a and 205b, respectively. At least one transistor of the first type, e.g., P-type transistors P4 and P6, can be coupled with the transistors P3 and P5, respectively. Gates of the transistors P4 and P6 can be coupled with the output nodes 205a and 205b, respectively.

Referring again to FIG. 2, the input nodes 201a and 201b of the level shifter 110a can be coupled with the decoding circuit 105 (shown in FIG. 1). The input nodes 201a and 201b can receive complementary voltage signals from the decoding circuit 105. The complementary voltage signals can turn on either the transistors N2-N3 or the transistors N5-N6.

Referring again to FIG. 2, gate nodes 207a and 207b of the transistors N1 and N4, respectively, can receive power-on-control (POC) signals. In some embodiments, the POC signals can turn on or off the transistors N1 and N4 during the operation of the level shifter 110a.

Power supply nodes 220a and 220b can be coupled with the gates of the transistors P3 and P5, respectively. Power supply nodes 230a and 230b can be coupled with the sources of the transistors P4 and P6, respectively. The power supply nodes 220a-220b and 230a-230b can be coupled with a power supply voltage VDD3. In embodiments level-shifting the input voltage signals swinging between 0 V and 0.9 V to between 0 V and 3.3 V, the power supply voltage VDD3 can be about 1.8 V.

Following is a description regarding an exemplary operation of the level shifter 110a. In some embodiments, the complementary voltage signals applied on the input nodes 201a-201b and the POC signals applied on the gate nodes 207a-207b can couple the ground voltage VSS with the output node 205b and isolate the ground voltage VSS from the output node 205a. The grounded output node 205b can turn on the transistor P6. The turned-on transistor P6 can couple the power supply voltage VDD3, e.g., 1.8 V, with the gate of the transistor P1, turning on the transistor P1. The turned-on transistor P1 can couple the power supply voltage VDD1, e.g., 3.3 V, to the output node 205a. The 3.3-V output node 205a can result in the turn-on of the transistor P3. The turned-on transistor P3 can couple the power supply voltage VDD1 to the gate of the transistor P2, turning off the transistor P2.

In other embodiments, the complementary voltage signals applied on the input nodes 201a-201b and the POC signals applied on the gate nodes 207a-207b can couple the ground voltage VSS with the output node 205a and isolate the ground voltage VSS from the output node 205b. The grounded output node 205a can turn on the transistor P4. The turned-on transistor P4 can couple the power supply voltage VDD3, e.g., 1.8 V, to the gate of the transistor P2, turning on the transistor P2. The turned-on transistor P2 can couple the power supply voltage VDD1, e.g., 3.3 V, to the output node 205b. The 3.3-V output node 205b can result in the turn-on of the transistor P5. The turned-on transistor P5 can couple the power supply voltage VDD1 to the gate of the transistor P1, turning off the transistor P1.

It is found that the gates of the transistors P1 and P2 can receive complementary voltage signals that can swing between the voltage levels about 1.8 V and about 3.3 V. Due to the voltage swing, the voltage drop $V_{GS}$ between the gate and the source of each of the transistors P1-P6 can be no more than about 1.8 V. The voltage drop $V_{GS}$ of about 1.8 V or less can desirably reduce the gate dielectric layer integrity issue. In some embodiments, each of the transistors P1, P2, N1, and N4 can be a high voltage (HV) device. The HV device can have asymmetric source and drain structures. For example, a drain side of the HV device can have a lightly doped drain (LDD) that can sustain the voltage drop $V_{DS}$ between the drain and the source of the HV device. The asymmetric HV device can desirably reduce the hot carrier injection issue.

Figure 3:
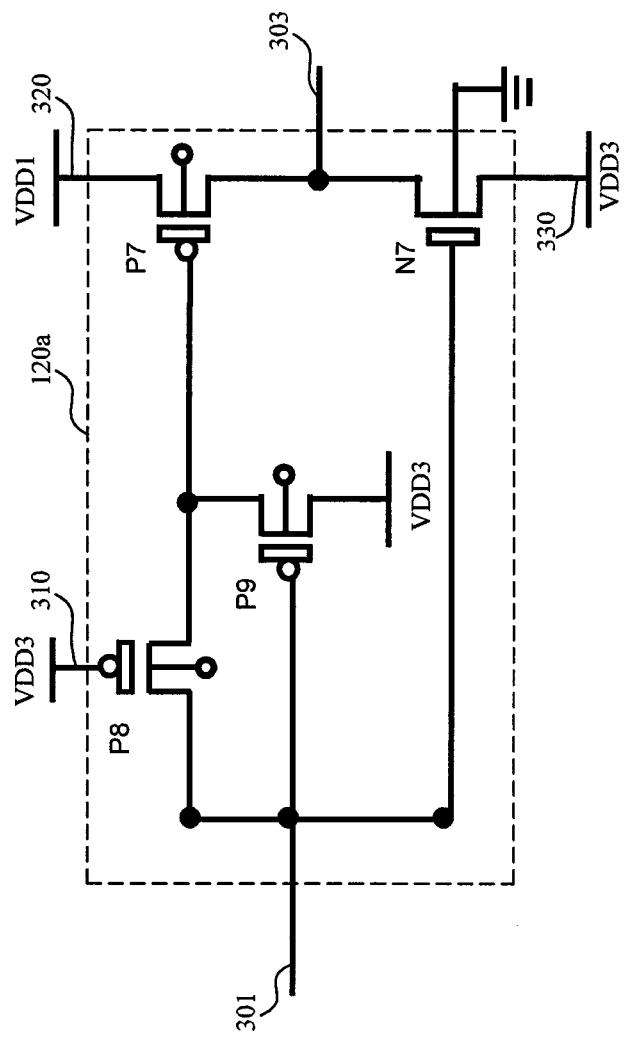
FIG. 3 is a schematic drawing illustrating an exemplary inverter.

FIG. 3 is a schematic drawing illustrating an exemplary inverter. In FIG. 3, the inverter 120a can include an input node 301 and an output node 303. The input node 301 can be coupled with the level shifter 110a (shown in FIG. 1). The output node 303 can be coupled with the output buffer 130 (shown in FIG. 1).

The inverter 120a can include at least one transistor of the first type, e.g., P-type transistor P7, coupled between a power supply node 320 and an output node 303 of the inverter 120a. The power supply node 320 can be coupled with the power supply voltage VDD1, e.g., 3.3 V. At least one transistor of the second type, e.g., N-type transistor N7, can be coupled between an input node 301 of the inverter 120a and the output node 303 of the inverter 120a. The transistor N7 can be coupled with a power supply node 330 that can be coupled with the power supply voltage VDD3, e.g., 1.8 V.

Referring to FIG. 3, the inverter 120a can include a transistor of the first type, e.g., P-type transistor P8. The transistor P8 can be coupled between the gate of the transistor P7 and the input node 301 of the inverter 120a. The gate of the transistor P8 can be coupled with a power supply 310 that can be coupled with the power supply voltage VDD3, e.g., 1.8 V.

The inverter 120a can include at least one transistor of the first type, e.g., P-type transistor P9. The transistor P9 can be coupled with the transistor P8. The gate of the transistor P9 can be coupled with the input node of the inverter 120a. The transistor P9 can be coupled with the power supply voltage VDD3, e.g., 1.8 V.

In embodiments receiving a 3.3-V voltage signal at the input node 301, the 3.3-V voltage signal can result in the turn-on of the transistor P8. The turned-on transistor P8 can couple the 3.3-V voltage signal to the gate of the transistor P7, turning off the transistor P7. The 3.3-V voltage signal can also turn off the transistor P9 and turn on the transistor N7. The turned-on transistor N7 can couple the power supply voltage VDD3 with the output node 303. The output node 303 can output the voltage signal having the power supply voltage VDD3.

In other embodiments receiving a 0-V voltage signal at the input node 301, the 0-V voltage signal turn on the transistor P9 and turn off the transistor N7. The turned-on transistor P9 can couple the power supply voltage VDD3 with the gate of the transistor P7, turning on the transistor P7. The turned-on transistor P7 can couple the power supply voltage VDD1 with the output node 303. The output node 303 can output the voltage signal having the power supply voltage VDD1.

It is found that the gates of the transistor P7 can receive a voltage signal that swings between about 1.8 V and about 3.3 V. Due to the voltage swing, the voltage drop $V_{GS}$ between the gate and the source of the transistor P7 can be no more than about 1.8 V. The voltage drop $V_{GS}$ of about 1.8 V or less can desirably reduce the gate dielectric layer integrity issue. In some embodiments, the transistor N7 can be a high voltage (HV) device. The HV devices can have asymmetric source and drain structures. For example, a drain side of the HV device can have a lightly doped drain (LDD) that can sustain the voltage drop $V_{DS}$ between the drain and the source of the HV device. The asymmetric HV device can desirably reduce the hot carrier injection issue.

FIG. 4 is a schematic drawing illustrating a system including an exemplary integrated circuit disposed over a substrate board. In FIG. 4, a system 400 can include an integrated circuit 402 disposed over a substrate board 401. The substrate board 401 can include a printed circuit board (PCB), a printed wiring board and/or other carrier that is capable of carrying an integrated circuit. The integrated circuit 402 can be similar to the integrated circuit 100 described above in conjunction with FIG. 1, respectively. The integrated circuit 402 can be electrically coupled with the substrate board 401. In some embodiments, the integrated circuit 402 can be electrically coupled with the substrate board 401 through bumps 405. In some other embodiments, the integrated circuit 402 can be electrically coupled with the substrate board 401 through wire bonding. The system 400 can be part of an electronic system such as computers, wireless communication devices, computer-related peripherals, entertainment devices, or the like.

In some embodiments, the system 400 including the integrated circuit 402 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

One aspect of this description relates to an integrated circuit. The integrated circuit includes a first level shifter configured to receive a first input signal and a first power supply signal, the first level shifter configured to output a first output signal. The integrated circuit further includes a first inverter configured to receive the first output signal from the first level shifter, the first inverter configured to output a first inverter signal. The integrated circuit further includes a second level shifter configured to receive a second input signal and a second power supply signal, the second level shifter configured to output a second output signal, wherein a voltage level of the second power supply signal is different from a voltage level of the first power supply signal. The integrated circuit further includes a second inverter configure to receive the second output signal from the second level shifter, the second inverter configured to output a second inverter signal. The integrated circuit further includes an output buffer configured to receive the first inverter signal and the second inverter signal, the output buffer configured to output a buffer output signal.

Another aspect of this description relates to a level shifter. The level shifter includes at least one first transistor of a first type having a gate configured to receive a first input signal that swings between a first voltage level and a second voltage level. The level shifter further includes at least one second of the first type having a gate configured to receive a second input signal that swings between the first voltage level and the second voltage level, the second input signal being complementary with the first input signal. The level shifter further includes a third transistor of the first type between the at least one first transistor of the first type and a first output node, the third transistor of the first type having a gate configured to receive a first power-on-control (POC) signal.

The level shifter further includes a fourth transistor of the first type between the at least one second transistor of the first type and a second output node, the fourth transistor of the first type having a gate configured to receive a second POC signal. The level shifter further includes a first transistor of a second type coupled between a first power supply node and the first output node and a second transistor of the second type coupled between a second power supply node and the second output node.

Still another aspect of this description relates to an inverter. The inverter includes a first transistor of a first type having a gate configured to receive an input signal, the first transistor connected to a first power supply node. The inverter further includes a second transistor of the first type having a terminal configured to receive the input signal, the second transistor of the first type having a gate connected to a second power supply node, and the second transistor of the first type connected to the first transistor of the first type. The inverter further includes a third transistor of the first type connected between a third power supply node and an output node, the third transistor of the first type having a gate connected to the first transistor of the first type and the second transistor of the first type. The inverter further includes a first transistor of a second type connected between a fourth power supply node and the output node, the first transistor of the second type having a gate configured to receive the input signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first level shifter configured to receive a first input signal and a first power supply signal, the first level shifter configured to output a first output signal;
   a first inverter configured to receive the first output signal from the first level shifter, the first inverter configured to output a first inverter signal;
   a second level shifter configured to receive a second input signal and a second power supply signal, the second level shifter configured to output a second output signal, wherein a voltage level of the second power supply signal is different from a voltage level of the first power supply signal;
   a second inverter configured to receive the second output signal from the second level shifter, the second inverter configured to output a second inverter signal; and
   an output buffer configured to receive the first inverter signal and the second inverter signal, the output buffer configured to output a buffer output signal.

2. The integrated circuit of claim 1, wherein the output buffer comprises:
   a first transistor of a first type configured to receive the first inverter signal; and
   a first transistor of a second type connected to the first transistor of the first type and configured to receive the second inverter signal.

3. The integrated circuit of claim 2, wherein the first transistor of the first type is configured to receive the first power supply signal.

4. The integrated circuit of claim 2, wherein at least one of the first transistor of the first type or the first transistor of the second type comprises an asymmetric source/drain structure.

5. The integrated circuit of claim 1, wherein the first power supply signal has a voltage level of about 3.3 volts, and the second power supply signal has a voltage level of about 1.8 V.

6. The integrated circuit of claim 1, wherein at least one of the first level shifter or the second level shifter comprises:
   at least one first transistor of a first type having a gate configured to receive a first input signal that swings between a first voltage level and a second voltage level;
   at least one second of the first type having a gate configured to receive a second input signal that swings between the first voltage level and the second voltage level, the second input signal being complementary with the first input signal;
   a third transistor of the first type between the at least one first transistor of the first type and a first output node, the third transistor of the first type having a gate configured to receive a first power-on-control signal;
   a fourth transistor of the first type between the at least one second transistor of the first type and a second output node, the fourth transistor of the first type having a gate configured to receive a second POC signal;
   a first transistor of a second type coupled between a first power supply node and the first output node; and
   a second transistor of the second type coupled between a second power supply node and the second output node.

7. The integrated circuit of claim 1, wherein at least one of the first inverter or the second inverter comprises:
   a first transistor of a first type having a gate configured to receive an input signal, the first transistor connected to a first power supply node;
   a second transistor of the first type having a terminal configured to receive the input signal, the second transistor of the first type having a gate connected to a second power supply node, and the second transistor of the first type connected to the first transistor of the first type;
   a third transistor of the first type connected between a third power supply node and an output node, the third transistor of the first type having a gate connected to the first transistor of the first type and the second transistor of the first type; and a first transistor of a second type connected between a fourth power supply node and the output node, the first transistor of the second type having a gate configured to receive the input signal.

8. A level shifter comprising:
at least one first transistor of a first type having a gate configured to receive a first input signal that swings between a first voltage level and a second voltage level;
at least one second of the first type having a gate configured to receive a second input signal that swings between the first voltage level and the second voltage level, the second input signal being complementary with the first input signal;
a third transistor of the first type between the at least one first transistor of the first type and a first output node, the third transistor of the first type having a gate configured to receive a first power-on-control signal;
a fourth transistor of the first type between the at least one second transistor of the first type and a second output node, the fourth transistor of the first type having a gate configured to receive a second POC signal;
a first transistor of a second type coupled between a first power supply node and the first output node; and
a second transistor of the second type coupled between a second power supply node and the second output node.

9. The level shifter of claim 8, wherein the third transistor of the first type and the fourth transistor of the first type are capable of sustaining a higher voltage drop than the at least one first transistor of the first type and the at least one second transistor of the first type.

10. The level shifter of claim 8, further comprising:
a third transistor of the second type having a gate coupled to the first output node and a terminal coupled to a third power supply node; and
a fourth transistor of the second type having a gate coupled to the second output node and a terminal coupled to a fourth power supply node, wherein a voltage level of the third power supply node and the fourth power supply node is different from a voltage level of the first power supply node and the second power supply node.

11. The level shifter of claim 8, further comprising:
a third transistor of the second type having a terminal coupled to the first output node and a gate coupled to a third power supply node; and
a fourth transistor of the second type having a terminal coupled to the second output node and a gate coupled to a fourth power supply node, wherein a voltage level of the third power supply node and the fourth power supply node is different from a voltage level of the first power supply node and the second power supply node.

12. The level shifter of claim 11, wherein the third transistor of the second type is configured to control a connection between the second output node and the second power supply node, and the fourth transistor of the second type is configured to control a connection between the first output node and the first power supply node.

13. The level shifter of claim 8, wherein at least one of the third transistor of the first type, the fourth transistor of the first type, the first transistor of the second type, or the second transistor of the second type comprises an asymmetric source/drain structure.

14. The level shifter of claim 8, wherein the first type is an n-type and the second type is a p-type.

15. An inverter comprising:
a first transistor of a first type having a gate configured to receive an input signal, the first transistor connected to a first power supply node;
a second transistor of the first type having a terminal configured to receive the input signal, the second transistor of the first type having a gate connected to a second power supply node, and the second transistor of the first type connected to the first transistor of the first type;
a third transistor of the first type connected between a third power supply node and an output node, the third transistor of the first type having a gate connected to the first transistor of the first type and the second transistor of the first type; and
a first transistor of a second type connected between a fourth power supply node and the output node, the first transistor of the second type having a gate configured to receive the input signal.

16. The inverter of claim 15, wherein a voltage level of the first power supply node, a voltage level of the second power supply node, and a voltage level of the fourth power supply node are substantially equal.

17. The inverter of claim 16, wherein a voltage level of the third power supply node is different from the voltage level of the first power supply node.

18. The inverter of claim 15, wherein the first transistor of the second type comprises an asymmetric source/drain structure.

19. The inverter of claim 15, wherein the first type is a p-type and the second type is an n-type.

20. The inverter of claim 2, wherein the first type is a p-type and the second type is an n-type.

* * * * *